(12) United States Patent
Mordarski

(10) Patent No.: US 7,397,308 B2
(45) Date of Patent: Jul. 8, 2008

(54) TRAVELING WAVE AMPLIFIER WITH DISTRIBUTED REGENERATIVE FEEDBACK BETWEEN DRAIN-TO-DRAIN TRANSMISSION LINES AND GATE-TO-GATE TRANSMISSION LINES FOR ENHANCED HIGH FREQUENCY BANDWIDTH

(76) Inventor: William Mordarski, 27 Westgate Ct., Colts Neck, NJ (US) 07722

( * ) Notice: Subject to any disclaimer, the term of this patent is extended or adjusted under 35 U.S.C. 154(b) by 117 days.

(21) Appl. No.: 11/524,453

(22) Filed: Sep. 21, 2006

(65) Prior Publication Data

US 2008/0074191 A1    Mar. 27, 2008

(51) Int. Cl.
*H03F 3/60* (2006.01)
*H03F 3/68* (2006.01)
*H03F 1/38* (2006.01)

(52) U.S. Cl. ................. 330/286; 330/295; 330/112

(58) Field of Classification Search ............ 330/54, 330/112, 286, 295
See application file for complete search history.

(56) References Cited

U.S. PATENT DOCUMENTS 4,853,649 A * 8/1989 Seino et al. ............ 330/277
5,066,925 A * 11/1991 Freitag ................. 330/269

* cited by examiner

*Primary Examiner*—Steven J Mottola
(74) *Attorney, Agent, or Firm*—Mandel & Peslak, LLC; Arthur M. Peslak, Esq.

(57) ABSTRACT

An improved traveling wave amplifier is disclosed. The improvements to the traveling wave amplifier disclosed include designing the drain-to-drain and gate-to-gate transmission lines as coupled pairs thereby coupling energy back to the input from the output. The result is increased bandwidth without an increase in device count or resorting to a cascade configuration.

2 Claims, 6 Drawing Sheets

TRAVELING WAVE AMPLIFIER WITH DISTRIBUTED REGENERATIVE FEEDBACK BETWEEN DRAIN-TO-DRAIN TRANSMISSION LINES AND GATE-TO-GATE TRANSMISSION LINES FOR ENHANCED HIGH FREQUENCY BANDWIDTH

BACKGROUND OF THE INVENTION

The present invention is directed to an improvement of the Traveling Wave Amplifier (TWA) (a/k/a Distributed Amplifier) shown in FIG. 1. Typically there are several FET devices (1) where the gates and drains of the FETs are connected with transmission lines, (3) and (2) respectively. The gate-to-gate transmission lines are designed to cancel reflections due to the capacitances of the FET gates, and incrementally absorb the energy from the input signal. Similarly, the drain-to-drain transmission lines are designed to cancel reflections due to capacitances of the FET drains and also to sum the amplified signal with the correct delay from each FET. The result, for a well-designed amplifier, is flat gain response and low input and output reflection over a wide band. Termination networks (4) and (5) provide low-frequency match at the input and output respectively. The bandwidth of the amplifier is determined by the capacitances of each individual FET as well as the realized gain per FET of the amplifier. For any particular device, in order to increase the bandwidth, one must either design for lower gain, or use additional devices. Recently it has become common practice to obtain additional bandwidth by replacing each FET device in the amplifier with a Cascode pair (1) and (2) as shown in FIG. 2. This practice improves bandwidth by reducing the effect of the so-called "Miller Capacitance" of each device. But this practice also increases the device count by a factor of 2, requires a more complicated bias network, and can be difficult to stabilize.

OBJECT AND ADVANTAGES

The object of the present invention is to provide enhanced, stable, bandwidth for a TWA amplifier topology with minimal number of devices in a circuit that is simple to fabricate for both hybrid and monolithic realizations.

SUMMARY OF THE INVENTION

Referring to FIG. 3, the enhanced bandwidth is achieved by designing the drain-to-drain and gate-to-gate transmission lines as coupled pairs, thereby coupling some energy back to the input from the output. The result is a small amount of distributed regenerative feedback (DRF) which provides a controlled degree of high frequency peaking. When optimized for flat gain, the frequency slope and phase of the feedback-induced peaking is set to closely match the natural gain roll-off from device parasitic elements. The |S21| bandwidth can thereby be increased without the need for increasing device count or by resorting to a Cascode configuration.

The simplicity of the amplifier of the present invention is enhanced due to:

(1) reduced device count; and
(2) Simplified layout owing to the fact that the gate and drain terminals of microwave FET devices are physically close to each other. Therefore, the gate-to-gate transmission lines are most conveniently placed physically close to the drain-to-drain transmission lines for both the hybrid and MMIC realizations. This close proximity of the transmission lines produces the desired regenerative feedback.

DETAILED DESCRIPTION

Figure 1:
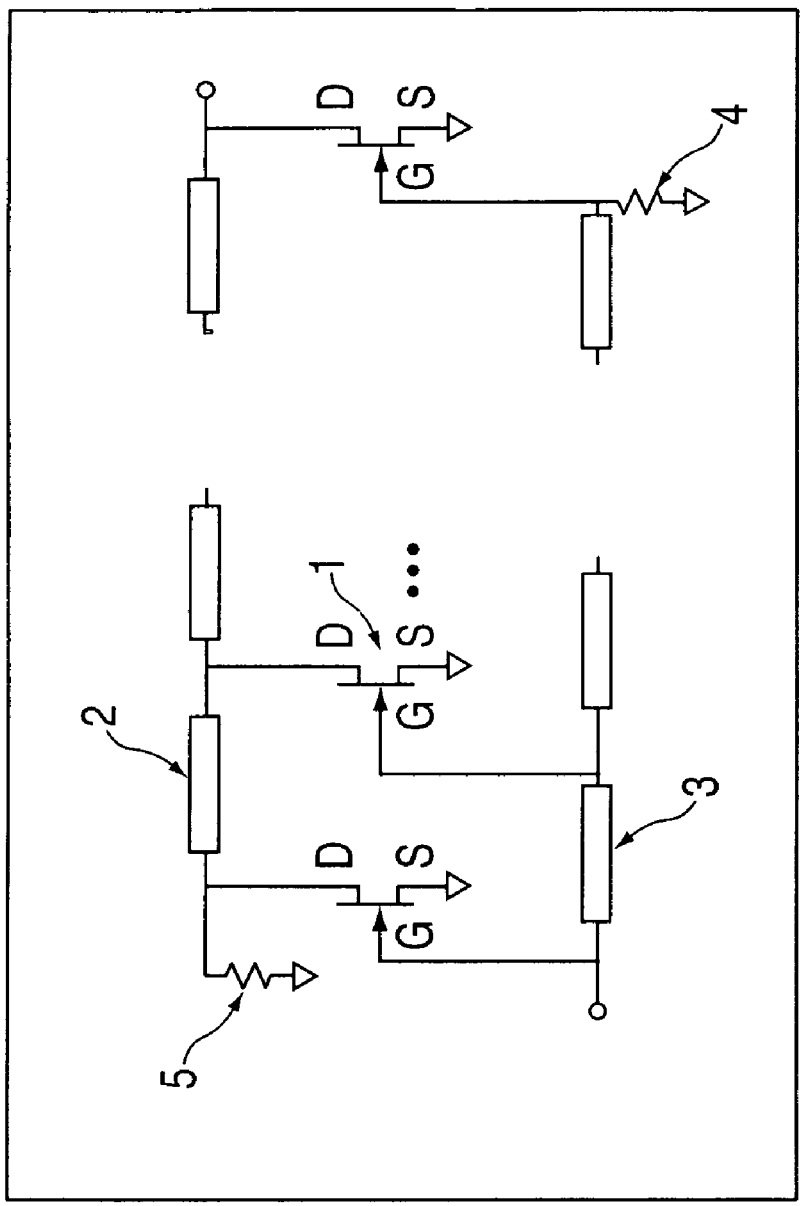
FIG. 1 is a schematic of a prior art traveling wave amplifier.
Figure 2:
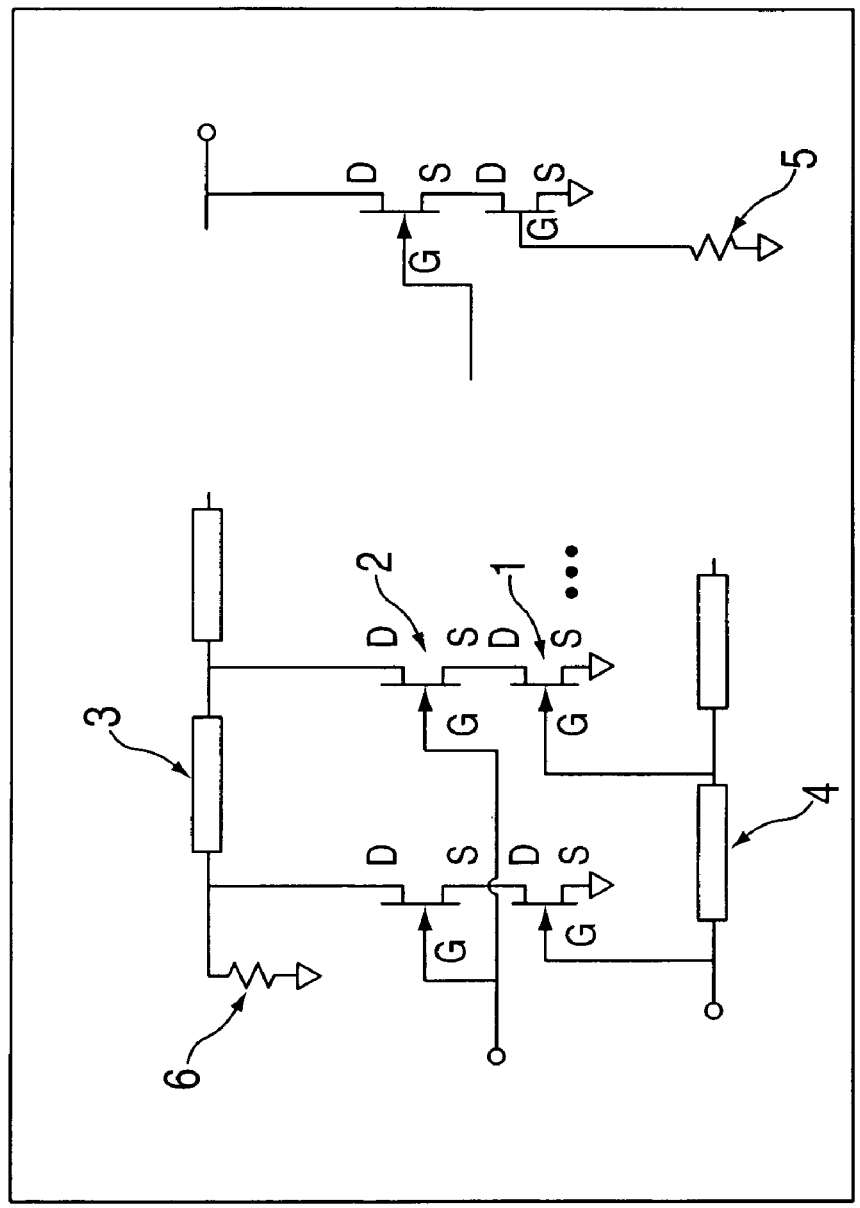
FIG. 2 is a schematic of a prior art Cascode traveling wave amplifier.

The prior art traveling wave amplifiers and Cascode traveling wave amplifiers are illustrated schematically in FIGS. 1 and 2. As explained in the Background of the Invention section above, these configurations suffer from defects that are solved by the present invention.

Figure 3:
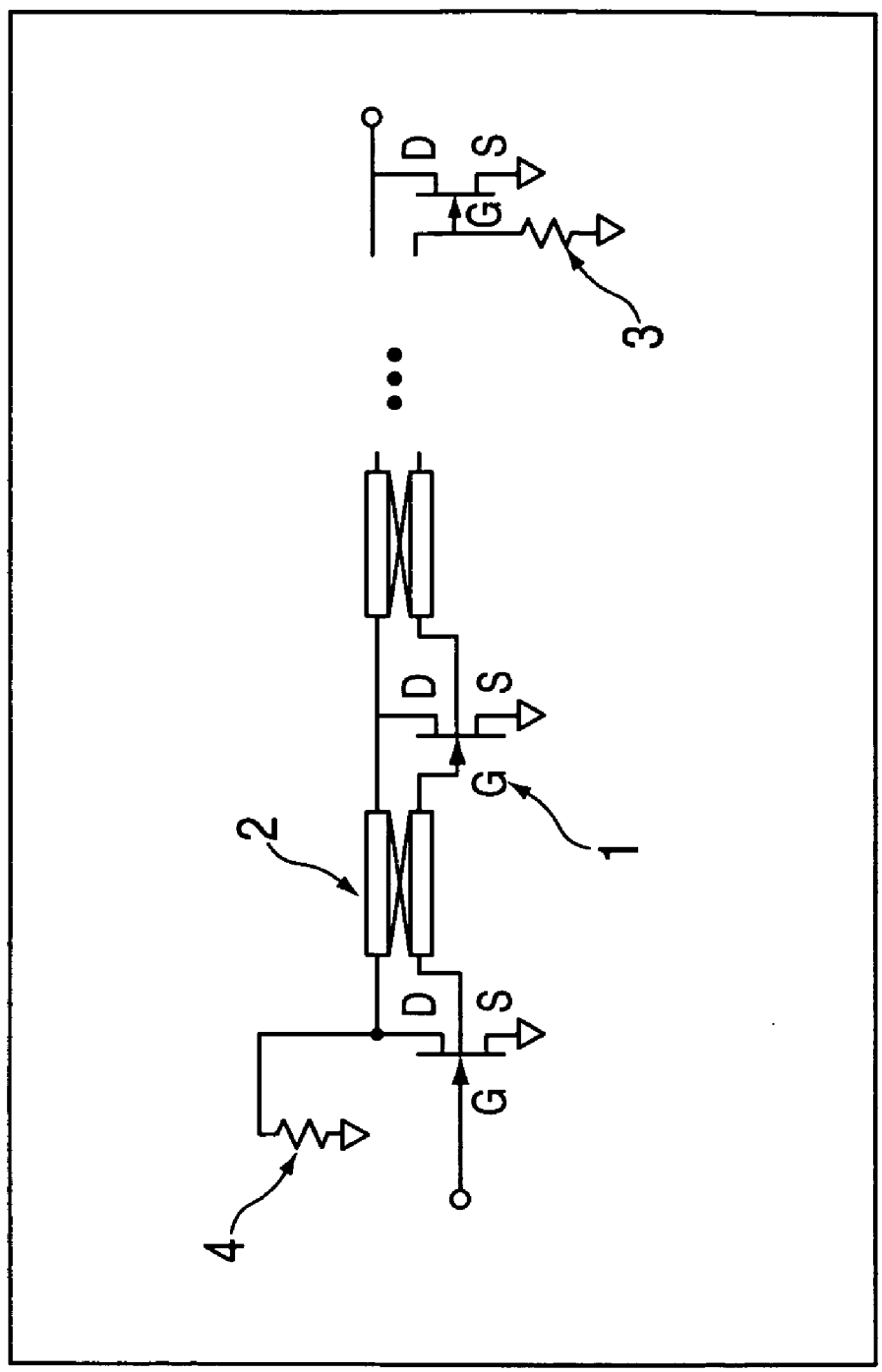
FIG. 3 is a schematic of the present invention.
Figure 4:
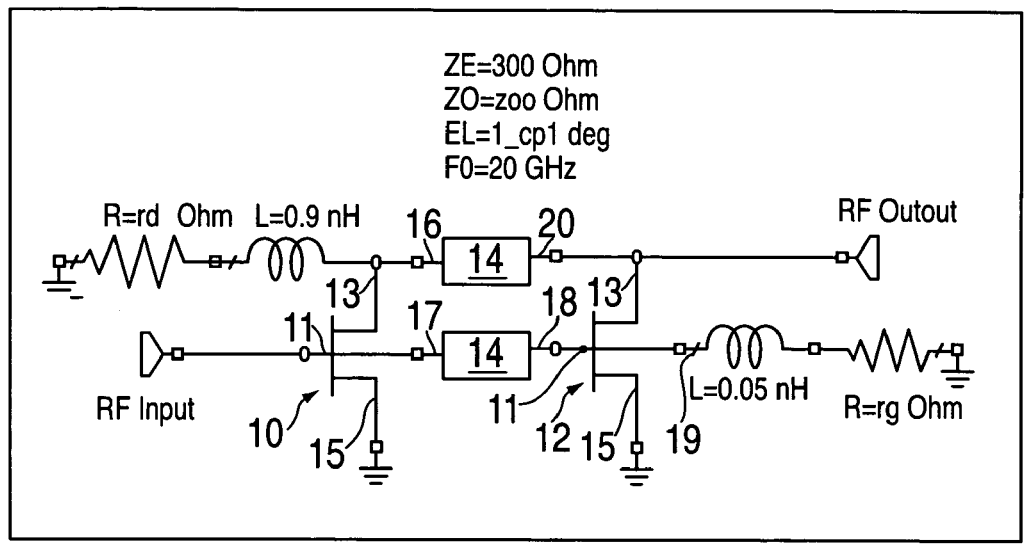
FIG. 4 is a schematic of the present invention to illustrate gain analysis.
Figure 5:
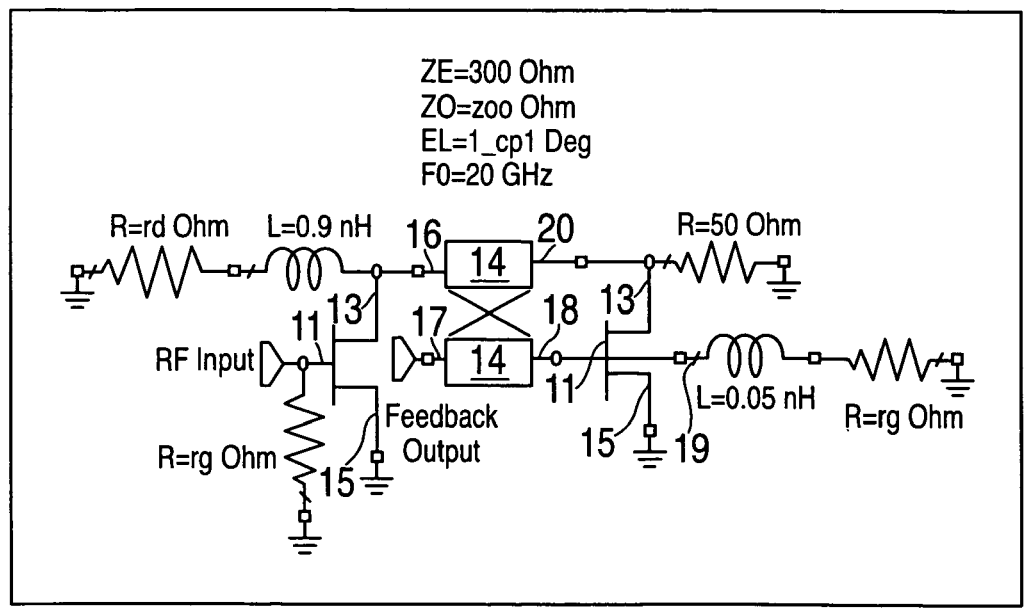
FIG. 5 is a schematic of the present invention to illustrate feedback analysis.
Figure 6:
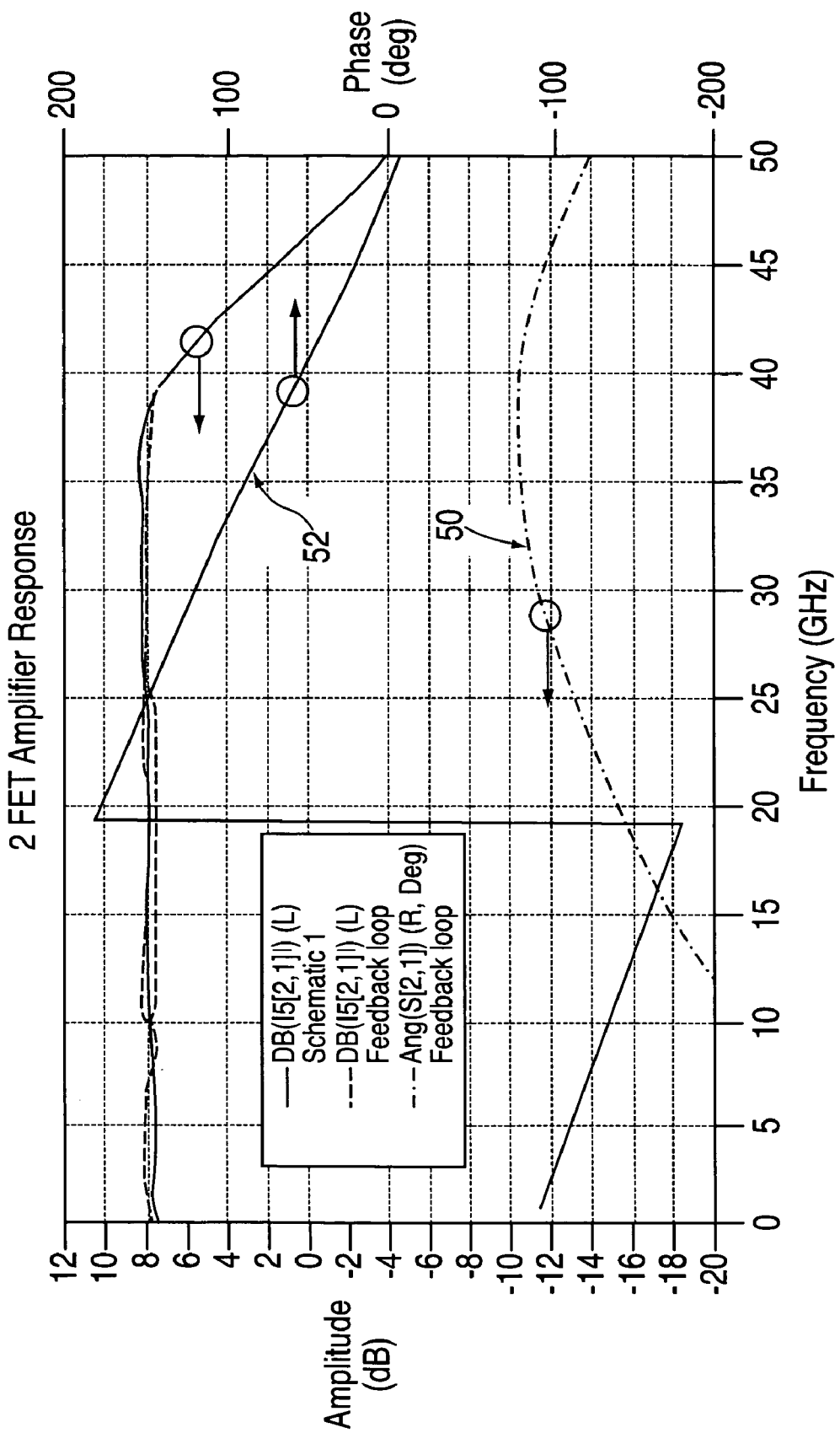
FIG. 6 is a graphical representation of the gain response and feedback response of the present invention.

Referring to FIG. 3, the amplifier circuit is shown to include a plurality of semiconductor amplifier devices (1) each having an input electrode or gate (g) and output electrode or drain (d), a plurality of coupled transmission line pairs (2), and input and output termination networks (3) and (4). In the preferred embodiment, illustrated in FIG. 4, there are 2 FET devices, (10), (12), and a coupled transmission line pair (14) connected between the FET gate terminals (11) and drain terminals (13), in keeping with the object of wide bandwidth with low device count. In operation, a signal is fed to the input electrode of (10), and subsequently to the input electrode of the next semiconductor, (12), through the gate-to-gate transmission line (17), (18) which provides the correct time delay to cause cancellation of reflections from the device input electrodes, and finally into the input termination network (19) providing for a low reflection at the amplifier input terminal. The output electrodes of the semiconductor devices are likewise connected through the drain-to-drain transmission line (16), (20) with a time delay designed to provide both-reflection and cancellation from the FET output electrodes, and signal summation of the amplified FET outputs. The gate-to-gate transmission line (17), (18) is designed to be physically in close proximity to the drain-to-drain transmission line (16), (20) to allow some of the amplified signal present on the drain-to-drain line to couple back to the gate-to-gate line. The amplitude of feedback signal is determined by the physical separation of the drain transmission lines from the gate transmission lines. The phase of the feedback signal is determined by the length of the line pair. For the purpose of computing the precise effect of the coupling by computer modeling, the coupled transmission lines can be described by the so-called even-mode and odd-mode impedances, ($Z0e$, $Z0o$), and the phase length at a specified frequency as shown in FIG. 5. The graph in FIG. 6 shows a computer simulation of a computer-optimized DRF amplifier made with commercially available FET devices. This circuit has been computer-optimized for flat gain from DC to 40 GHz. Referring to the circuit of FIG. 5, the amplitude and phase of the feedback signal can be analyzed by "breaking the loop" at the input and thereby computing the signal returned to the input by the amplifier network. This is also shown in the graph in FIG. 6. The amplitude of the feedback signal is shown by the trace labeled (50), and the phase of the feedback signal is shown by the trace labeled (52). It is shown in this plot that the amplitude increases towards the high frequency end of the band, and the phase tends toward 0°. This in-phase feedback effectively enlarges the input signal as the amplifier gain is rolling off, resulting in enhanced bandwidth.

Figure 7:
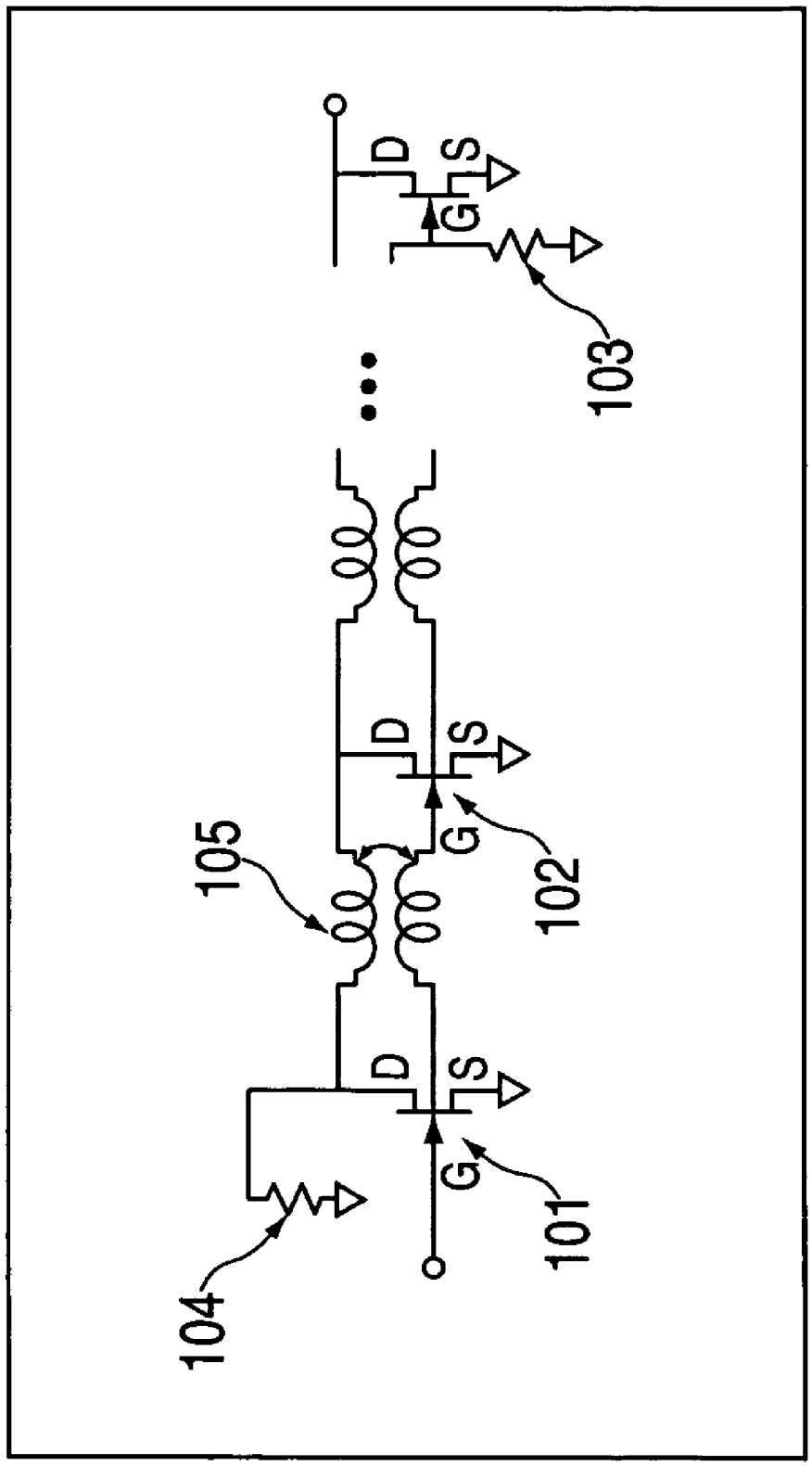
FIG. 7 is a schematic of an alternate embodiment of the present invention.

FIG. 7 illustrates one alternative embodiment of the present invention. In this embodiment, a plurality of FET amplifiers (101), (102), (103) are utilized. One skilled in the art may use this technique with the variation of using coupled-inductor models (105) in place of the coupled-line pairs. This alternate embodiment is the same technique with a different, and less accurate, method of computing the terminal parameters of the gate-to-gate and drain-to-drain coupling networks using self and mutual inductances as shown in FIG. 7.

One skilled in the art will recognize that the foregoing merely represents embodiments of the present invention. Many obvious modifications may be made thereto without departing from the spirit or scope of the present invention as set forth in the appended claims.

The invention claimed is:

1. A method of enhancing bandwidth of traveling wave amplifiers comprising the following steps:
   a. Providing a plurality of semiconductor amplifier devices each comprising input terminals and output terminals;
   b. Providing a plurality of coupled transmission line pairs connected between gate terminals and drain terminals of each of the amplifier devices wherein the gate terminals and drain terminals are in close physical proximity;
   c. Sequentially connecting the input terminals of the plurality of semiconductor amplifier devices by means of one of the plurality of coupled transmission line pairs;
   d. Sequentially connecting the output terminals of the plurality of semiconductor amplifying devices by means of the other of the plurality of coupled transmission line pairs; and
   e. Introducing positive feedback from the output of each semiconductor amplifier device to the input of each semiconductor device.

2. A broadband traveling-wave amplifier comprising:
   a. A plurality of semiconductor amplifier devices;
   b. A plurality of coupled transmission line pairs connected between gate terminals and drain terminals of each of the amplifier devices wherein the gate terminals and drain terminals are in close physical proximity;
   c. An input termination network; and
   d. An output termination network;

where said semiconductor amplifier devices have their input terminals sequentially connected to each other through one direct path of said coupled transmission line pairs, and the output terminals of said semiconductor amplifier devices are sequentially connected to each other through the other direct path of said coupled transmission line pairs.

* * * * *